United States Patent [19]

Park

[11] Patent Number: 5,449,108
[45] Date of Patent: Sep. 12, 1995

[54] METHOD FOR FORMING A BUMP ON A SEMICONDUCTOR DEVICE

[75] Inventor: Joon S. Park, Seoul, Rep. of Korea

[73] Assignee: Goldstar Electron Co., Ltd., Choongchungbook, Rep. of Korea

[21] Appl. No.: 213,430

[22] Filed: Mar. 15, 1994

[30] Foreign Application Priority Data

Mar. 17, 1993 [KR] Rep. of Korea ............... 4089/1993

[51] Int. Cl.⁶ ............................................. H01L 21/00
[52] U.S. Cl. ............................. 228/103; 228/248.1; 228/254; 427/123
[58] Field of Search ............ 228/123.1, 180.22, 248.1, 228/254, 103, 104; 427/123, 405

[56] References Cited

U.S. PATENT DOCUMENTS

| | | |
|---|---|---|
| 4,831,494 | 5/1989 | Arnold et al. ........................ 361/306 |
| 4,866,507 | 9/1989 | Jacobs et al. ........................ 357/74 |
| 4,898,320 | 2/1990 | Dunaway et al. .................. 228/254 |
| 5,217,597 | 6/1993 | Moore et al. ....................... 228/254 |
| 5,266,522 | 11/1993 | Di Giacomo et al. ............. 437/192 |
| 5,289,631 | 3/1994 | Koopman et al. .................. 228/254 |

*Primary Examiner*—Samuel M. Heinrich
*Attorney, Agent, or Firm*—Lowe, Price, LeBlanc & Becker

[57] ABSTRACT

A method for forming a bump on a semiconductor device takes advantage of the solderability difference of the solder paste applied to a solder pad in order to form a bump, so that it does not require an etching process. In addition, a pre-test of the semiconductor device can be carried out in a state that the solder pad is united with a BLM layer, so as to prove out semiconductor devices of good quality in advance of finishing the formation of the bump and the semiconductor devices of good quality can be applied with a subsequent process.

5 Claims, 4 Drawing Sheets

007
METHOD FOR FORMING A BUMP ON A SEMICONDUCTOR DEVICE

BACKGROUND OF THE INVENTION

1. Field of the Invention

The present invention relates, in general, to a method for forming a bump on a semiconductor device and, more particularly, to a method for forming a bump on a semiconductor device, advantageous in simplicity and permitting examination of the semiconductor device for defects in advance of the formation of the bump.

2. Description of the Prior Art

Recently, there have been developed a bare chip surface mounting method by which a semiconductor device is directly mounted on the surface of a substrate in a bare chip state thereof without packaging the semiconductor device. In general, on an aluminum pad of a semiconductor device, there is formed a bump for contacting with a substrate, which then serves as an intermediate to mount the semiconductor device on the surface of the substrate. Such semiconductor device mounted on the substrate in a bare chip state potentially has significant advantages over one in a package state, including shorter signal transfer path, better electrical characteristic and smaller size. These advantages enable an article including the mounted semiconductor device to be light, thin, compact and small.

In mounting a bare chip on the surface of a substrate, the following description for of a conventional formation processes for a bump on a semiconductor device, along with the problems generated therefrom, is given for better understanding of the background of the present invention, with reference to FIGS. 1A–1H.

FIGS. 1A through 1H, illustrates the conventional processes for forming a bump on an aluminum pad of a semiconductor device.

Firstly, on a predetermined portion of a semiconductor substrate 1, an aluminum pad 2, and a chrome (Cr), a copper (Cu) and a gold (Au) layers are formed, in due order, and subjected to an electroplating to form a ball limiting metallurgy (hereinafter, "BLM") layer 3 over the resulting structure, as shown in FIG. 1A.

On the entire upper surface of the BLM layer 3, there is laminated a photo resist layer 4 in a predetermined thickness, as shown in FIG. 1B.

Next, a photo resist removing region is defined over the photo resist layer 4 by using a metallic mask, as shown in FIG. 1C.

The metal mask is then subjected to an exposing and developing process, to remove the photo resist layer 4 and to open the photo resist above the aluminum pad 2. As a result, there appears a region where a bump is to be formed, as shown in FIG. 1D.

Thereafter, using an electroplating process, a bump (generally, solder) is deposited over the region, to form a bump having a predetermined thickness, as illustrated in FIG. 1E.

The remaining photo resist are is removed, as shown in FIG. 1F.

A chemical etching process is applied to the resulting structure, to remove unnecessary portions of the BLM layer 3, leaving the bump 5 atop the BLM layer 5 on the aluminum pad 2 formed on the substrate 1, as illustrated in FIG. 1G.

Finally, the bump 5 is re-flowed and changed into the form of a ball, as shown in FIG. 1H. Reference numeral 6 designates a passivation.

In the formation of a bump with the conventional method, as described above, a BLM layer is formed entirely over the semiconductor device and a bump is formed on a predetermined portion of the BLM layer. Beside the predetermined portion of the BLM, other portions, that is, the portions uncovered with the bump must be removed. For this purpose, an etching process is preceeded, but since it is intricate, an over etching or an under etching may occur between the solder and the BLM layer so that a crack is generated or the boundary of a bump is opened or shorted.

In addition, since testing of the semiconductor device is impossible in advance of the formation of the bump, it is not possible to detect defects of the semiconductor device until directly examining the semiconductor device.

Consequently, the conventional method for forming a bump on a semiconductor device, as illustrated above, is disadvantageous in the production yield and the productivity of semiconductor devices due to the inevitable BLM layer etching process and the impossibility of the pre-test.

SUMMARY OF THE INVENTION

For solving the aforementioned problems, the present inventors have recognized that there exists a need for a novel method for forming a bump on a semiconductor device, improved in aspects of simplicity, easiness and efficiency.

Therefore, it is an object of the present invention to provide a method for forming a bump on a semiconductor device, free from an electroplating process of a solder and an etching process, thereby simply and easily performing it.

It is another object of the present invention to provide a method for forming a bump on a semiconductor device, capable of carrying out a pre-test, thereby improving the production yield and the productivity of semiconductor devices.

In accordance with the present invention, the above objects can be accomplished by providing a method for forming a bump on a semiconductor device, comprising: a first step of providing a plurality of chrome pads and a plurality of corresponding test pads 13 on one surface of a ceramic heating plate, connecting the plurality of chrome pads with the plurality of corresponding test pads through a plurality of fine chrome lines, respectively and screen-printing a solder paste on the chrome pads, so as to form a plurality of solder pads; a second step of forming a photoresist layer having a predetermined thickness over an aluminum pad formed on a predetermined portion of a semiconductor device, in such a way as to cover the semiconductor device and the aluminum pad, etching the photoresist layer above the predetermined portion of the semiconductor device to expose the aluminum pad and forming a ball limiting metallurgy (BLM) layer on the aluminum pad; a third step of bonding the solder pad formed in the first step with the BLM layer formed in the second step, the solder pad being aligned with the BLM layer and by means of the test pad provided on the ceramic heating plate, to testing for defects of the semiconductor device; and a fourth step of heating each of the solder pad of the tested semiconductor device to a temperature not less than the solder paste's melting point to bond the solder pad with the BLM layer in a solder ball form and to separate the solder pad from the ceramic heating plate the only in case that the semiconductor was proved out to be of good quality in the third step.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1A:
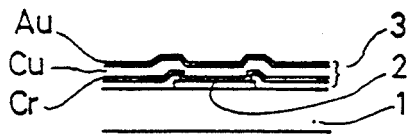
FIGS. 1A through 1H are schematic sectional views illustrating conventional formation processes for forming a bump on a semiconductor device.
Figure 1B:
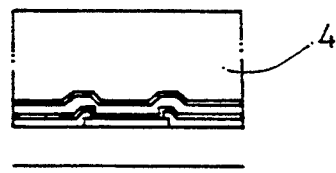
Figure 1C:
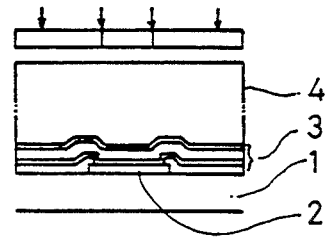
Figure 1D:
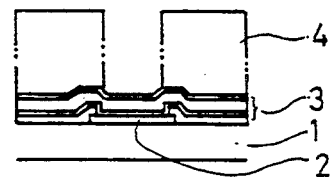
Figure 1E:
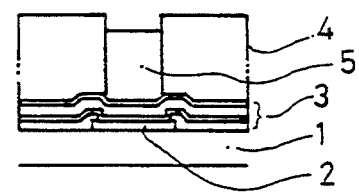
Figure 1F:
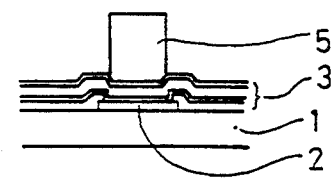
Figure 1G:
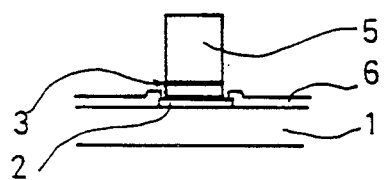
Figure 1H:
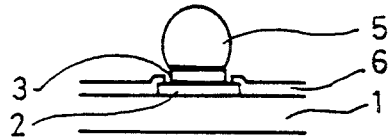

Hereinafter, the preferred embodiment of the present invention will be, in detail, described with reference to the accompanying drawings, wherein like reference numerals designate like parts, respectively.

Figure 2:
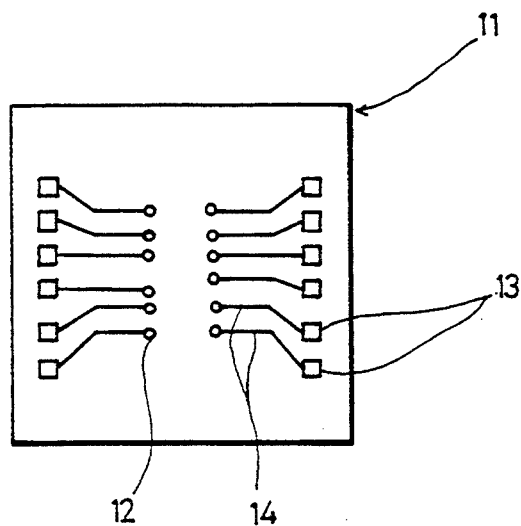
FIG. 2 is a schematic plan view showing a ceramic heating plate provided with chrome pads, test pads and fine chrome lines, according to the present invention.

Referring initially to FIG. 2, there is shown a ceramic heating plate 11. To one surface of a ceramic heating plate 1 having a predetermined size, as shown in this drawing, there are provided a plurality of chrome pads 12 connected with a plurality of corresponding test pads 13 through a plurality of corresponding fine chrome lines 14.

Figure 3:
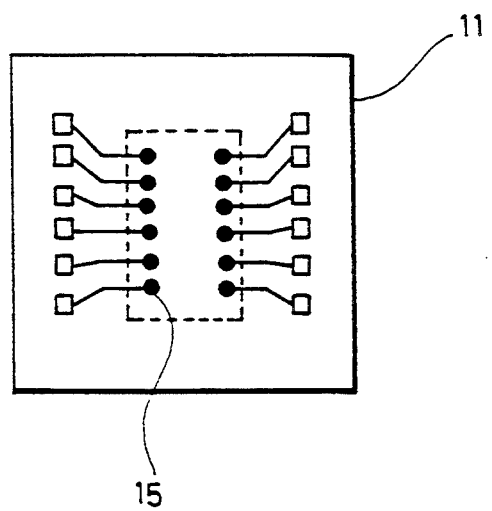
FIG. 3 is a schematic plan view showing the solder pads formed on the ceramic heating plate of FIG. 2.

Next, FIG. 3 shows a plurality of solder pads 15, which are formed by screenprinting a solder paste on the chrome pads 13.

Figure 4:
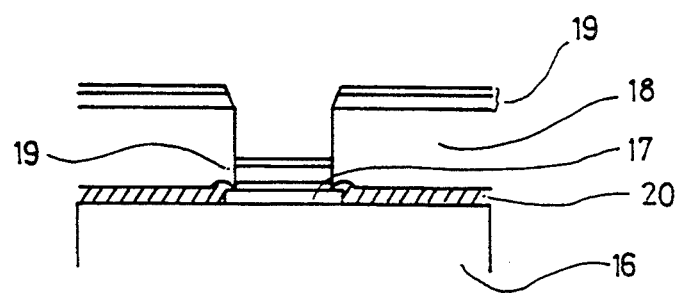
FIGS. 4 and 5 are schematic sectional views showing a BLM layer formed on an aluminum pad of a semiconductor device, according to the present invention.
Figure 5:
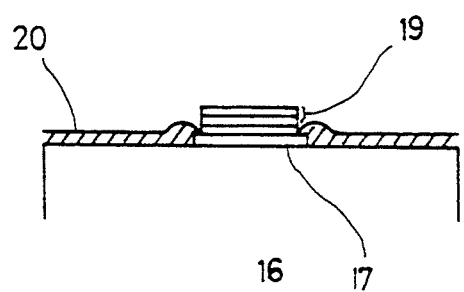

Referring now FIG. 4, there is illustrated a processes for the formation of the BLM layer. First, on a predetermined portion of a semiconductor device 16, as illustrated in this figure, there is a formed an aluminum pad 17, which is then laminated with a photo resist to form a photoresist layer 18 covering the aluminum pad 17 and the semiconductor device 16. Subsequently, the photoresist layer 18 is subjected to an etching process to open the photoresist layer 18 above the predetermined portion of the semiconductor device 1, exposing the aluminum pad 17. Thereafter, there are deposited Cr, Cu and Au, in due order, so as to form a BLM layer 19, as shown in FIG. 4. Then the rest of the photoresist layer 18 is removed, as shown in FIG. 5. At this moment, the BLM layer 19, which is deposited on the photoresist layer 18, is also removed together with the photoresist layer 18.

FIG. 5 shows that the remaining photoresist layer 18 is removed.

Figure 6:
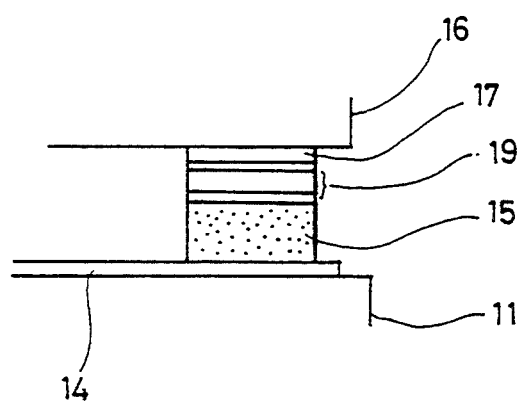
FIG. 6 is a schematic sectional view showing the ceramic heating plate of FIG. 3 aligned with the semiconductor device of FIG. 5.

Turning now to FIG. 6, there is a linkage between the ceramic heating plate 11 and the semiconductor device 16. As shown in this drawing, the solder pad 15 of the ceramic heating plate 11 is united with the BLM layer 19 of the semiconductor device in such a way that they are aligned with each other.

In the linkage state, the aluminum pad 17 of the semiconductor device 16 becomes conductive by virtue of the viscous property of the solder paste. Due to the conduction of the semiconductor device 16, it can be subjected to a pre-test. That is, a pre-test for the conductive semiconductor device 16 can be executed by the test pad 13 on the ceramic heating plate 11. Only a semiconductor device that is proved to be of good quality in the pre-test can proceed to a subsequent process.

Figure 7:
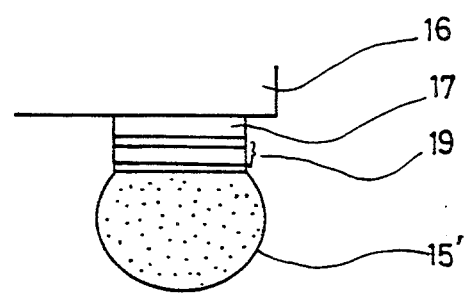
FIG. 7 is a schematic sectional view of a bump formed on the semiconductor device, according to the present invention.

Finally, the solder paste of the solder pad 15 united with the BLM layer of the semiconductor device of good quality is heated to a temperature not less that its melting point to bond the solder pad 15 with the BLM layer 19 and to separate the solder pad 15 from the ceramic heating plate 11, forming a bump 15' of solder ball shape, as shown in FIG. 7.

The solder pad 15 which is in contact with the chrome pad 12 is bonded with the BLM layer 19 by the solderability thereof while being reflowed and the chrome pad 12 may easily be separated from the solder pad 15 because the adhesive force of the chrome is lower than that of the gold in the BLM layer 19.

Reference numeral 20 designates a passivation for stabilizing the surface of the semiconductor device.

As described above in detail, the present invention provides the effects that the method for forming a bump on a semiconductor device is simply and easily obtained because the solder pad is formed by a screen printing not by an electroplating, and the bump is formed by the difference in the solderability of the solder pad so that the conventional etching process is not required.

In addition, a pre-test of the semiconductor device can be carried out in a state such that a solder pad is united with a BLM layer, so as to prove out the good quality in advance of the formation of the bump on the semiconductor device, and the semiconductor device proved to be a good quality can be applied with a subsequent process. Therefore, the present invention contributes greatly to improve the production yield and the productivity of semiconductor devices.

Although the preferred embodiments of the invention have been disclosed for illustrative propose, those skilled in the art will appreciate that various modifications and additions are possible, without departing from the scope and spirit of the invention as recited in the accompanying claims.

What is claimed is:

1. A method for forming a bump on a semiconductor device, the method comprising the steps of:

providing a plurality of chrome pads and a plurality of corresponding test pads on one surface of a ceramic heating plate, connecting said plurality of chrome pads with said plurality of corresponding test pads through a plurality of fine chrome lines, respectively, and screen-printing a solder paste on said plurality of chrome pads, so as to form a plurality of solder pads;

forming a photoresist layer having a predetermined thickness over an aluminum pad formed on a predetermined portion of a semiconductor device, in such a way as to cover said semiconductor device and said aluminum pad, etching said photoresist layer above said predetermined portion of said semiconductor device to expose said aluminum pad and forming a ball limiting metallurgy (BLM) layer on said aluminum pad;

bonding said solder pad with said BLM layer, said solder pad being aligned with said BLM layer and taking advantage of said test pad provided on said ceramic heating plate to examine said semiconductor device for defects; and heating said solder pad of said examined semiconductor device to a temperature not less than a melting point of the solder paste to bond said solder pad with said BLM layer in a solder ball form and to separate said solder pad from said ceramic heating plate, said examined semiconductor being proved out be a good quality.

2. A method of testing a semiconductor device for defects prior to a bump formation, the method comprising the steps of:

coupling a plurality of test pads to a plurality of corresponding first pads on a surface of a plate;

forming a solder paste on each of the plurality of first pads to form a plurality of solder pads;

forming a plurality of conductive layers on each of a plurality of second pads on the semiconductor device including the steps of:

forming a photoresist layer over the semiconductor device;

etching the photoresist layer above the plurality of second pads to expose the second pads;

laying the plurality of conductive layers on the semiconductor device; and removing the photoresist layer and the plurality of conductive layers surrounding the second pads;

coupling each corresponding solder pad of the plate to each corresponding conductive layer on the semiconductor device;

testing the semiconductor device for defects using the test pads; and transferring the plurality of solder pads from the plate to the conductive layers of the plurality of second pads on the semiconductor device after the testing step indicates the semiconductor device to be of a predetermined quality.

3. The method of claim 2, wherein the step of forming the solder paste comprises the step of screen-printing the solder paste.

4. The method of claim 2, wherein the transferring step comprises the step of:

bonding the solder pads to the conductive layers of the plurality of second pads;

heating the solder pads to a temperature greater than a melting point of the solder paste to bond the solder pads to the conductive layers in a solder ball form.

5. The method of claim 2, wherein the first and second pads are formed of chrome and aluminum, respectively, and the plurality of conductive layers is a ball limiting metallurgy layer having chrome, copper and gold layers.

* * * * *